United States Patent [19]

Minakuchi

[11] 4,331,926
[45] May 25, 1982

[54] PROGRAMMABLE FREQUENCY DIVIDER
[75] Inventor: Hiroshi Minakuchi, Shiga, Japan
[73] Assignee: Matsushita Electric Industrial Co., Ltd., Kadoma, Japan
[21] Appl. No.: 118,850
[22] Filed: Feb. 5, 1980
[30] Foreign Application Priority Data
  Mar. 15, 1979 [JP] Japan .................. 54-30757
[51] Int. Cl.³ .................................... H03K 21/36
[52] U.S. Cl. .......................... 328/48; 307/224 R
[58] Field of Search ............... 328/48, 46; 307/224 R
[56] References Cited
U.S. PATENT DOCUMENTS
3,967,205 6/1976 Rossi et al ......................... 328/46
3,976,946 8/1976 Schroder ........................ 328/48 X
3,992,635 11/1976 Suzuki et al. .................. 328/48 X

*Primary Examiner*—John S. Heyman
*Attorney, Agent, or Firm*—Cushman, Darby & Cushman

[57] ABSTRACT

A programmable frequency divider includes a programmable counter which comprises flip-flops 1 to 11 of a number less by one than the number of bits in a program value. The divider has first and second control circuits 101, 102 which respectively control every half period of a preset divided output pulse alternately, the second control circuit acting to delay the moment of the control in response to the least significant bit having a selected logic level, thereby enabling one to reduce the clock pulse frequency to a half in comparison with a conventional one. One can also obtain an optional sub-output signal of twice or one-half the frequency of a preset frequency output signal. Refer to FIG. 2.

8 Claims, 3 Drawing Figures

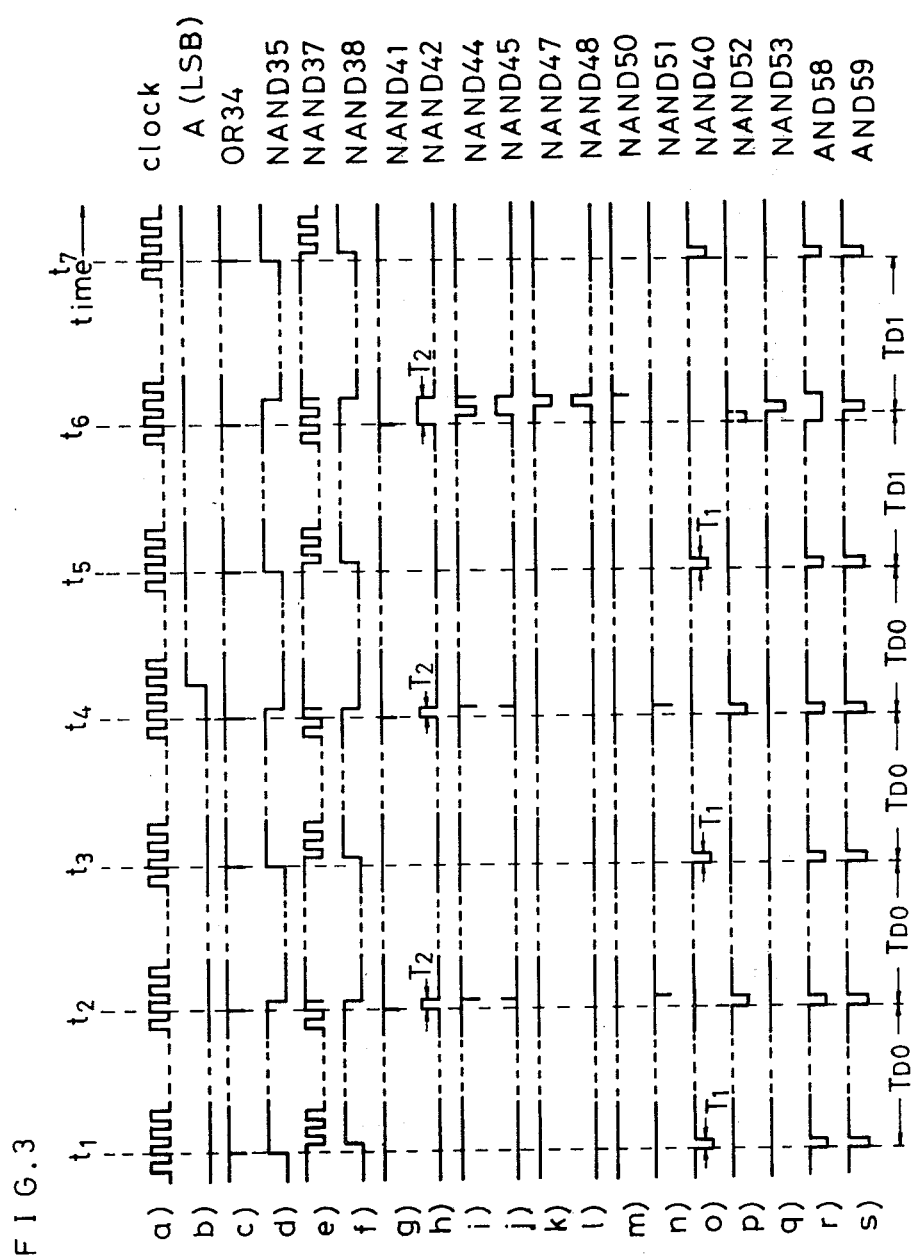

PROGRAMMABLE FREQUENCY DIVIDER

BACKGROUND OF THE INVENTION

1. Field of the Invention

The present invention relates to a programmable frequency divider.

2. Prior Art

Hitherto, a programmable counter constituted by a down counter of a preset-type or an up counter of a reset-type has been used as a programmable frequency divider. However, as is well known, a normal programmable counter could change the program value by only one clock pulse unit. Therefore in a case where a nominal output frequency of the programmable frequency divider is 2,000 Hz and its output frequency is required to be changed by about 1 Hz unit, a nominal dividing value of 2,000 is needed and the frequency of the clock pulse required is 4 MHz.

This kind of programmable frequency divider has been used as a part of a frequency synthesizer in rotation control apparatus of a record player or in a citizen band (CB) radio transceiver. In this kind of apparatus, since the whole of the electric circuit is rather complex and large in scale, a principal circuit including the programmable frequency divider is very often constructed by a one-chip LSI (Large Scale Integration) IC, or alternatively, at least by a digital MSI (Medium Scale Integration) IC for general use. The power consumption of these digital ICs usually increases in proportion to a rise in the frequency of the clock pulse. For example, in a CMOS-IC (Complementary Metal Oxide Semicondutor IC) which is suitable for large scale integration, current consumption increases in proportion to the rise in the frequency of the clock pulse and in IIL-IC (Integrated Injection Logic IC), it is necessary to effect a preliminary amplification of an injection current when use of a clock pulse of high frequency is intended.

An increase in power consumption necessitates an electric power source of a large capacity. Also the life time of a battery such as a dry battery in a portable apparatus is shortened, and the high power consumption increases the amount of heat produced in the circuit components. This lowers the reliability of the apparatus and also prevents a miniturization of the package into a one-chip LSI.

SUMMARY OF THE INVENTION

The present invention provides a programmable frequency divider comprising:

a programmable counter which counts clock pulses applied to an input terminal thereof, and having program terminals for application of a program value except the least significant bit thereof, a detecting means which generates a count-end pulse upon detection of the end of a counting operation of said programmable counter, a first control circuit which controls restarting of said counting operation of said programmable counter after a lapse of time $T_1$ from a first pulse generation of said detecting means, and a second control circuit which controls restarting of said counting operation of said programmable counter after a lapse of time $T_2$ from a second pulse generation of said detecting means;

wherein the time $T_1$ and the time $T_2$ are the same duration when said least significant bit is one logic level and differ by one clock pulse period when said least significant bit is the other logic level.

The frequency divider according to the invention can perform the same function as a conventional programmable frequency divider and uses a clock pulse having no more than half of the clock pulse frequency compared to a conventional one. Such a programmable frequency divider can provide optional alternative output signals whose frequency is twice or one-half the frequency of a programmed output main output signal.

BRIEF DESCRIPTION OF THE DRAWING

FIGS. 3(a) to 3(s) are waveform charts showing wave forms at different parts of the circuits of FIGS. 1 and 2.

DESCRIPTION OF PREFERRED EMBODIMENT

Figure 1:
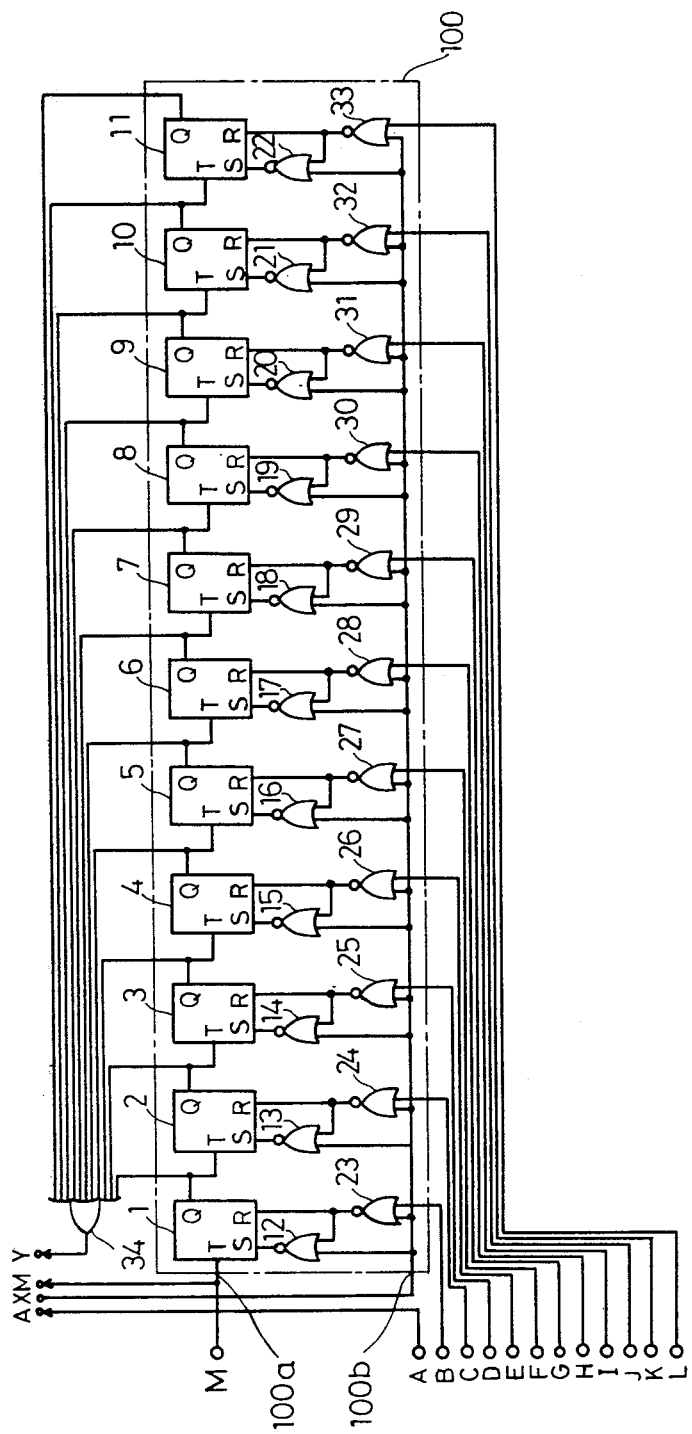
FIG. 1 is a circuit diagram showing a counter forming part of one example of frequency divider according to the present invention.
Figure 2:
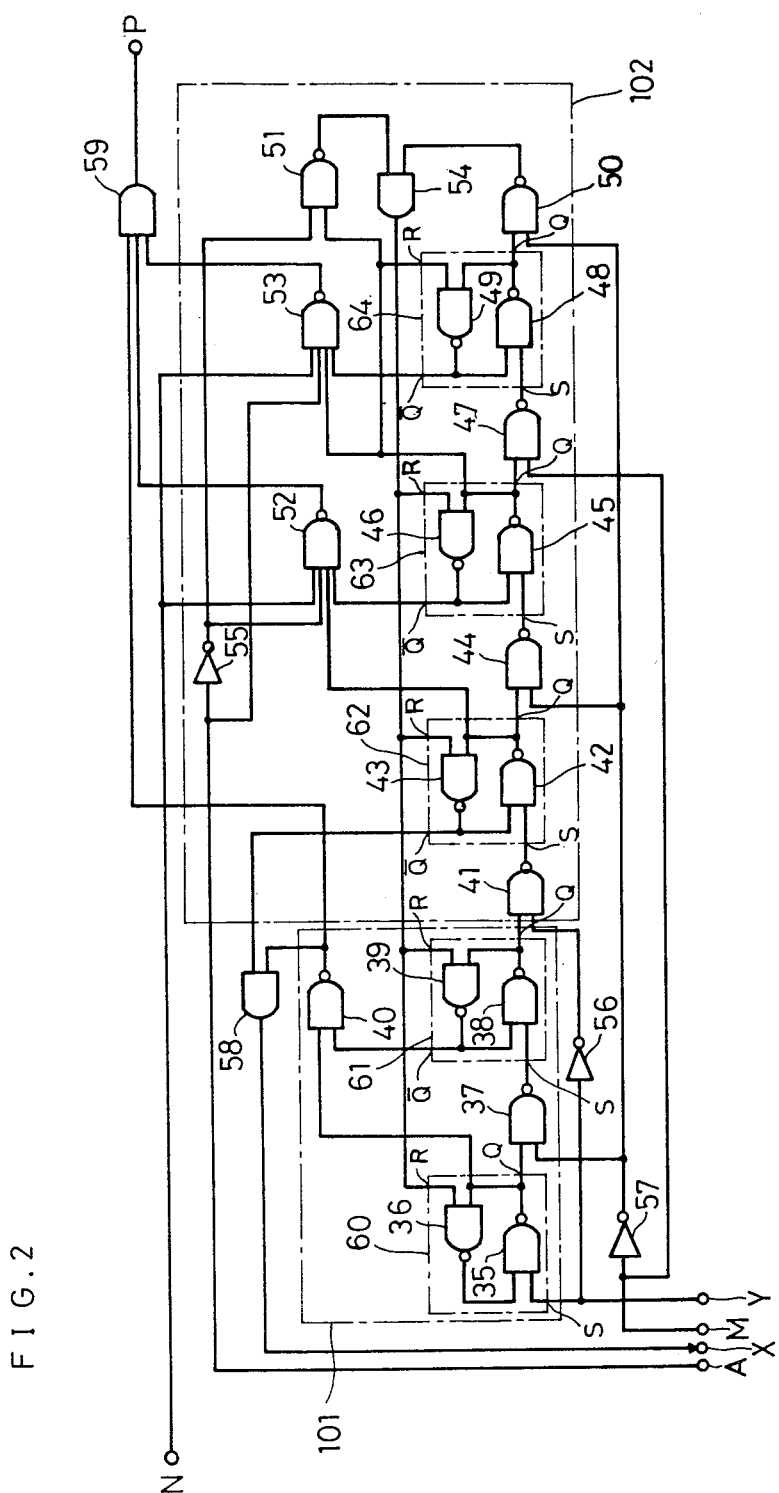
FIG. 2 is a circuit diagram showing an example of a control circuit arrangement forming part of the present invention.

A circuit diagram of a programmable frequency divider embodying the present invention is shown in FIGS. 1 and 2.

FIG. 1 shows a counter part of the embodiment of the present invention. In FIG. 1, an input terminal M for a clock pulse is connected to an input terminal 100a of a programmable counter 100. The programmable counter 100 is an 11 bit binary down counter of a preset type and comprises eleven T-type flip-flops 1, 2 . . . 11 and twenty-two NOR gates 12, 13 . . . 32, 33 having two input terminals. All of the T-type flip-flops 1 to 11 are connected in series and the input terminal T of the T-type flip-flop 1 at a front end of the series connection constitutes the input terminal 100a. A terminal 100b herein called a preset terminal is a terminal whereat preset signals are applied to the programmable counter 100. The terminal 100b is connected to one of two terminals of all the NOR gates 12 to 33. A, B, C, D, E, F, G, H, I, J, K, and L designate program terminals to receive program input signals for the programmable counter 100 and the program terminals A to L correspond in order to the 12 bits of a 12 bit binary code. The program terminals A and L correspond respectively to the least significant bit (LSB) and the most significant bit (MSB) of the binary code. As shown in FIG. 1, the program terminals B to L except A are connected to one of input terminals of the NOR gates 23 to 33, respectively. Output terminals of the NOR gates 23 to 33 are respectively connected to the other of the input terminals of the NOR gates 12 to 22 and to the reset terminals R of the T-type flip flops 1 to 11. All of output terminals Q of the T-type flip-flops 1 to 11 are connected to input terminals of an OR gate 34 in order to detect an end of counting of the programmable counter 100.

FIG. 2 shows a control circuit arrangement according to this embodiment of the present invention. This mainly consists of a first control circuit 101 and a second control circuit 102. The first control circut 101 as two RS type flip-flops (hereinafter referred to as RS-FF) 60 and 61 and two NAND gates 37 and 40. The RS-FF 60 consists of two NAND gates 35 and 36, and an input terminal of the NAND gate 35 (S input terminal) is connected to the output of the OR gate 34 (FIG. 1) through a terminal Y. The output signal Q of the RS-FF 60 and clock pulses inverted by an inverter 57 are fed to a NAND gate 37. The output signal of the NAND gate 37 is fed to the RS-FF 61 which consists of two NAND gates 38 and 39 as an S input signal. The output signal $\overline{Q}$ of the RS-FF 61 and the output signal Q of the RS-FF 60 are fed to the NAND gate 40.

The second control circuit 102 has three RS-FFs 62, 63 and 64 which consists of NAND gates 42 and 43, 45 and 46, and 48 and 49, seven NAND gates 41, 44, 47, 50, 51, 52 and 53, and AND gate 54 and an inverter 55. The output signal Q of the RS-FF 61 and an output signal of the OR gate 34 (inverted by an inverter 56) are fed to the NAND gate 41. Output signals $\overline{Q}$ of the RS-FFs 62, 63 and 64 are fed to the NAND gates 44, 47 and 50, respectively. The clock pulses are inverted by the inverter 57 and are fed to the NAND gates 44 and 50, and the clock pulses are fed uninverted to the NAND gate 47. An output signal Q of the RS-FF 62 and an output signal of the NAND gate 40 of the first control circuit 101 are fed to an AND gate 58, and an output signal of the AND gate 58 is fed to the preset terminal 100b through a terminal X. The program terminal A is connected to an input terminal of an inverter 55 and the NAND gate 53. The output signal of the inverter 55 is fed to the NAND gates 52 and 51. A terminal N is provided for changing frequency of an output signal, and is connected to one of the input terminals of the NAND gates 52 and 53. The output signal Q of the RS-FF 62 and the output signal $\overline{Q}$ of the RS-FF 63 are fed to the NAND gate 52. The output signals Q of the RS-FF 63 and the output signal $\overline{Q}$ of the RS-FF 64 are fed to the NAND gate 53. The output signal Q of the RS-FF 63 is also fed to the NAND gate 51 and to an R input terminal of the RS-FF 64, the R input terminal being one of the input terminals of the NAND gate 49. The output signal of the NAND gate 51 and the NAND gate 50 are fed to the AND gate 54, whose output signal is fed to the R input terminals of the RS-FFs 60, 61, 62 and 63. Ouput signals of the NAND gates 40, 52 and 53 are fed to the AND gate 59. An output terminal of the AND gate 59 is connected to an output terminal P of the programmable frequency divider.

OPERATION

The manner of operation will now be explained referring to the waveform charts of FIG. 3.

In FIG. 3, FIG. 3(a) shows a waveform of a clock pulse, FIG. 3(b) shows a waveform of least significant bit (LSB) applied to the input terminal A, and FIG. 3(c) shows a waveform of the output signal of the OR gate 34. This output signal as shown is a series of negative going pulses of negligible width. FIGS. 3(d), (3(e) and 3(f) respectively show waveforms of the output levels of the NAND gates 35, 37 and 38 of the first control circuit 101. FIGS. 3(g), 3(h), 3(i), 3(j), 3(k), 3(l), 3(m) and 3(n) respectively show waveforms of the output levels of the NAND gates 41, 42, 44, 45, 47, 48, 50 and 51 of the second control circuit 102. (FIG. 3(o) shows the output levels of the NAND gate 40. FIGS. 3(p) and 3(q) show the output levels of the NAND gates 52 and 53, respectively. And FIGS. 3(r) and 3(s) show the output levels of the AND gates 58 and 59, respectively.

In the following explanation, a logic level "1" shows (is) a higher logic level and a logic level "0" shows (is) a lower logic level.

Equally, however, without departing from the invention, the logic levels "1" and "0" could respectively be lower and higher logic levels respectively.

Before $t = t_1$, the RS-FFs 60, 61, 62 and 63 are in their reset state based on an output signal of the AND gate 54, and the output signals Q of the RS-FFs 60, 61, 62 and 63 namely the output signals of the NAND gates 35, 38, 42 and 45 are "0" state. The RS-FF 64 is in reset state based on an output signal of the RS-FF 63 and an output signal Q of the RS-FF 64. That is, the output signal of the NAND gate 48 is also "0" state. At that time, an inverted output signal $\overline{Q}$ of these RS-FFs 60 to 64 are "1" state and all of the NAND gates 37, 40, 41, 44, 47, 50, 51, 52 and 53 are also "1" state since at least one of these respective NAND gate input terminals are fed to "0" by the RS-FFs 60 to 64. "1" level signals are fed to all of respective input terminals of the AND gates 54, 58 and 59, thereby making all of them "1" state. Since "1" signal of the NAND gate 58 is fed to all of the NOR GATES 12 to 33 of the programmable counter 100, these NOR GATES are "0", and accordingly "0" signals of these NOR gates are fed to the S and R input terminals of the T-type flip-flops 1 to 11. Therefore the programmable counter 100 is counting the clock pulses applied to the input terminal M.

At the time $t = t_1$, when all of the output signals of the T-type flip-flops 1 to 11 are "0", namely the counting value is zero by the decimal system, these "0" level signals are fed to the OR gate 34 and thereby the output level of the OR gate 34 changes "1" to "0". Since the output signal of the OR gate 34 is fed to the S terminal of the RS-FF 60 through the terminal Y, the RS-FF 60 becomes in its set state. That is the output level of the NAND gate 35 changes "0" to "1" and thereby the output levels of the NAND gates 36 and 40 change "1" to "0" as shown in FIGS. 3(d) and 3(o). When the NAND gate 40 is "0", the AND gates 58 and 59 turn "0" as shown in FIGS. 3(r) and 3(s). Since the output signals of the AND gate 58 are fed to the NOR gates 12 to 33 through the terminal X, a program value applied to the program terminals B, C, D . . . L is sent to the T-type flip-flops 1 to 11 through the NOR gates 12 to 33.

For example, in a case where a program value of 2000 in the decimal system, namely "011111010000" in binary system, is applied to the program terminals, the values at (the states of) the program terminals L, K, J . . . C, B and A respectively correspond to the above binary code. When such program values of the program terminals B to L except A are respectively applied to the NOR gates 23 to 33, the output levels of the NOR gates 23, 24, 25, 27 and 33 become "1" and the output levels of the NOR gates 26, 28, 29, 30, 31 and 32 remain "0". In other words, the output levels of the NOR gates 23 to 33 correspond to the equivalent binary code of the chosen program value. The output levels of the NOR gates 15, 17, 18, 19, 20 and 21 become "1" in response to the output signals of the NOR gates 26, 28, 29, 30, 31 and 32.

Accordingly, the output levels of the T-type flip-flops 4, 6, 7, 8, 9 and 10 whose S input terminals receive a "1" level signal become "1" and the output levels of the T-type flip-flops 1, 2, 3, 5 and 11 whose R input terminals receive a "1" level signal remain "0". By such operations a number such as 1000 in the decimal system is preset to the programmable counter 100 as an initial value.

Since some output levels of the T-type flip-flops of the programmable counter 100 become "1", the output signal of the OR gate 34 goes back to "1" as shoen in FIG. 3(c). But there is no effect of the level changing of the OR gate 34 on the first control circuit 101 because of resetting since the RS-FF 60 is already reset, and also no effect on the second control circuit 102 since the NAND gate 41 is fed the "0" level signal from the NAND gate 38.

At a time after $t_1$ equal to half the clock pulse time period the output level of the inverter 57 changes from "0" to "1", then both of the input signals of the NAND gate 37 become "1", and thereby the NAND gate 37 turns from "1" to "0". The output signal of the NAND gate 37 is fed to the input terminal S of the RS-FF 61 and hence the RS-FF 61 becomes in its set state. That is the output level of the NAND gate 38 changes from "0" to "1" as shown in FIG. 3(f). At that time, the output level $\overline{Q}$ of the NAND gate 39 changes from "1" to "0" and thereby the output level of the NAND gate 40 goes back to "1" as shown in FIG. 3(o). Therefore the programmable counter 100 is released from the preset state and starts down counting the clock pulses from the preset value 1000 in decimal system.

By the way, the output level of the AND gate 59 changes to "1" again as shown in FIG. 3(s).

At the time $t=t_2$ when the thousandth clock pulse is applied at the clock pulse input terminal M, all of the output levels of the programmable counter 100 become "0", and thereby the output of the OR gate 34 changes to a "0" level. However the state of the RS-FF 60 does not change since it has been in set state. At this time, the output signal of the OR gate 34 is inverted by the inverter 56 and fed to the NAND gate 41, thereby the output level of the NAND gate 41 changes from "1" to "0". The output signal of the NAND gate 41 is fed to the input terminal S of the RS-FF 62, and hence the RS-FF 62 becomes in its set state. That is, the output level of the NAND gate 42 changes from "0" to "1" as shown in FIG. 3(h). With this change, the output level of the NAND gate 43 changes from "1" to "0".

At that time, as a signal "0" is applied to the program terminal A (the least significant bit terminal), a "1" level signal is given to the NAND gate 52 through the inverter 55. Suppose the "1" level signal is applied to the terminal N, then all of the input signal levels of the NAND gate 52 become "1" because of the level change of the NAND gate 42 into "1". Thereby the output level of the NAND gate 52 changes from "1" to "0" and simultaneously the output level of the AND gate 59 also changes from "1" to "0" as shown in FIG. 3(s).

At that time, the output level of the AND gate 58 becomes "0" by the change of the NAND gate 43, and the programmable counter 100 becomes preset to a program value of 1000 in decimal system again. Immediately thereafter the output level of the OR gate 34 goes back to "1", and hence the output level of the NAND gate 41 also goes back to "1" as shown in FIGS. 3(c) and (g).

At the time after $t_2$ equal to a half clock pulse period, the output level of the inverter 57 changes from "0" to "1", and the output level of the NAND gate 44 turns from "1" to "0" since the output level of the NAND gate 42 is "1" by this time. The output signal of the NAND gate 44 is fed to the input terminal S of the RS-FF 63, and hence this RS-FF becomes in its set state. That is, the output level of the NAND gate 45 changes from "0" to "1" as shown in FIG. 3(j). With this change the output level of the NAND gate 46 changes from "1" to "0".

The output signal of the NAND gate 45 is fed to one of the input terminals of the NAND gate 51, and a "1" level signal from the inverter 55 is fed to the other input terminal of the NAND gate 51 since the program terminal A is at a "0" level. Thereby, the NAND gate 51 turns to "0" and the AND gate 54 also turns to "0" from "1".

By the level changing of the AND gate 54, the RS-FFs 60 to 63 turn to their reset states. That is, the output levels of the NAND gates 36, 39, 43 and 46 all become "1", and hence those of the NAND gates 35, 38, 42 and 45 become "0".

By this operation, the output levels of the NAND gates 37 and 44 become "1" and the output levels of all gates go back to the levels before the time $t=t_1$.

At this time, since the output level of the AND gate 58 also goes back to "1", the programmable counter 100 is released from the preset state and again starts down counting of the clock pulses from the preset value 1000 in decimal unit.

At the time $t=t_3$, when the programmable counter 100 finishes down counting of one thousand clock pulses and the output level of the OR gate 34 becomes "0", the NAND gates 35, to 40, and the AND gate 58 work the same way as at the time $t=t_1$ (as shown in FIG. 3) and the programmable counter 100 is preset and then starts down counting again.

At the time $t=t_4$, when the down counting of one thousand pulses by the programmable counter 100 is finished and the output level of the OR gate 34 becomes "0", the NAND gates 41, to 46, 51 and 52, and AND gate 54 of the second control circuit 102, and furthermore the NAND gates 35 to 39 of the first control circuit 101, and the AND gates 58 and 59 work in the same way as at the time $t=t_2$, as shown in FIG. 3. That is to say, in the programmable counter 100, the program value 1000 in decimal system is preset in the counter and its starts down counting again.

For so long as the program value applied to the program terminals A to L does not change, the same operations as described above are repeated.

In the case where the program value is changed into 2001 in decimal system namely "011111010001" in the binary system after the time $t=t_4$, only the signal level applied to the program terminal A of the least significant bit changes from "0" to "1". However the present value 1000 of the programmable counter 100 does not change, since the input signals applied to the input terminals B to L are constant.

On this state, when the output level of the OR gate 34 changes from "1" to "0" at the end of the down counting, the first control circuit 101 and the AND gates 58 and 59 work in the same way as that at the time $t=t_1$ or $t_3$, because the level changing of the program terminal A does not have any influence of the first control circuit 101. And in the programmable counter 100, the value 1000 is preset in decimal unit and starts down counting again.

At the time $t=t_6$, when the down counting of one thousand pulses by the programmable counter 100 is finished and the output level of the OR gate 34 becomes "0", the output level of the NAND gate 41 turns to "0" as shown in FIG. 3(g), and thereby the output level of the NAND gate 43 turns to "0". The RS-FF 62 becomes in its set state. Furthermore, the output level of the AND gate 58 turns to "0" as shown in FIG. 3(r). However, the output level of the NAND gate 52 remains at "1" level and does not change, since the output level of the inverter 55 is "0" because of the "1" level signal from the program terminal A as shown by a dotted line in FIG. 3(p).

When the output level of the AND gate 58 becomes "0", the value 1000 (decimal system) is preset in the programmable counter 100, and thereby the output level of the OR gate 34 and the NAND gate 41 go back to "1".

At a time half a clock pulse period after the time $t_6$, the output level of the inverter 57 turns from "0" to "1", and the output level of the NAND gate 44 turns from "1" to "0", since the output level of the NAND gate 42 is "1" by this time. The output signal of the NAND gate 42 is fed to the input terminal S of the RS-FF 63 and this RS-FF 63 becomes set state. By the level changing of the NAND gate 45, input signals of all of the input terminals of the NAND gate 53 become "1" and the output level thereof turns from "1" to "0" and then the output level of the AND gate 59 turns from "1" to "0".

After a further half a clock pulse period passes, the output level of the NAND gate 47 turns from "1" to "0" and the RS-FF 64 turns into its set state. That is, the output level of the NAND gate 48 changes from "0" to "1" as shown in FIG. 3(l). With this change, the output level of the NAND gate 49 changes from "1" to "0". By the level changing of the NAND gate 49, the output levels of both the NAND gate 53 and the AND gate 59 go back to "1" as shown in FIGS. 3(q) and (s).

After a further half clock pulse period passes, namesly 1.5 times the clock pulse period has passed since time $t_6$, and the output level of the inverter 57 becomes "1", the output level of the NAND gate 50 changes from "1" to "0" and thereby that of the AND gate 54 changes from "1" to "0". The RS-FFs 60 to 63 are reset by the output signals of the AND gate 54, namely the output levels of the NAND gates 36, 39, 43 and 46 change to "1", and thereby those of NAND gates 35, 38, 42 and 45 change from "1" to "0".

Furthermore, the RS-FF 64 becomes in its set state by the changing of the level of the NAND gate 45, that is the output level of the NAND gate 49 goes back to "1", and thereby that of the NAND gate 48 goes back to "0" as shown in FIG. 3(l). Thereby, the output level of the NAND gate 50 goes back to "1" and that of the AND gate 54 also goes back to "1". Everyone of the RS-FFs 60 to 64 has already finished reversing by this time. Therefore the output levels of the NAND gates 37, 40, 41, 47, 51, 52 and 53, AND gates 58 and 59 are "1".

The output level of the NAND gate 43 is in "0" state from $t=t_6$ to a time which is 1.5 times of a clock pulse period later, and hence the output level of the AND gate 58 is also in "0" state during this term. The programmable counter 100 stops counting with preset state during this term.

At the end of the duration of 1.5 times the clock pulse period from the time $t_6$, the programmable counter 100 is released from the preset state and starts down counting of the preset 1000 (decimal system) clock pulses again.

At the time $t=t_7$, when the programmable counter 100 finishes down counting of one thousand clock pulses and the output level of the OR gate 34 becomes "0", the first control circuit 101 and the AND gates 58 and 59 work in the same way as at the time $t=t_5$. And hence, in the programmable counter 100, the value 1000 (decimal) is preset, so making the down counting start again.

After this time, this programmable frequency divider of the present invention repeats the operations of the period from $t_5$ to $t_7$.

In the waveform charts of FIG. 3, the numbers of the clock pulses from $t=t_1$ to $t=t_2$, from $t=t_2$ to $t=t_3$, from $t=t_3$ to $t=t_4$, from $t=t_4$ to $t=t_5$ and from $t=t_5$ to $t=t_6$ are one thousand and that from $t=t_6$ to $t=t_7$ is one thousand and one.

The programmable frequency divider shown in FIGS. 1 and 2 comprises the programmable counter 100, to which the program value except the LSB is applied through the program terminals B, C, . . . to L thereof, the detecting gate (OR gate) 34 which generates a count-end pulse after the end of a counting operation of the programmable counter, the first control circuit 101 which controls starting of the counting operation of the programmable counter 100 again after a lapse of $T_1$ time from a generation of a first counted pulse from the OR gate 34, and the second control circuit 102 which controls starting of the counting operation of the programmable counter 100 again after a lapse of $T_2$ time from a generation of a second counting end pulse from the OR gate 34, and the second control circuit controls the time in such a manner that the $T_2$ time has the same duration as $T_1$ time when the LSB is "0" and that the $T_1$ time and the $T_2$ time have a difference by one clock pulse period when the LSB is "1".

Accordingly, the number of the clock pulses occuring in the time from a generation of the divided output pulse by the first control circuit 101 through the AND gate 59 until the generation of the next divided output pulse becomes equal to the program value. At that time, the second divided output pulse is obtained from the second control circuit 102 in the middle of the divided output pulses of the first control circuit 101, thereby the frequency of the output signal can easily be changed to twice as high as or one-half as high as that of the frequency of the input signal. For example, in the embodiment of FIGS. 1 and 2, when the divided output frequency for the case of the terminal N is "0" taken as a reference, an output frequency of two times as high as that of the reference frequency can be obtained by changing the terminal N to "1". When the divided output frequency for the case of the terminal N is "1" taken as a reference, an output frequency of one half times as high as that of the reference frequency can be obtained by changing the terminal N to "0".

Hereupon, the NAND gate 53 of the second control circuit 102 is used for delaying, when the LSB is in "1" level, the leading edge of the second divided output pulse by a half clock period from the leading edge of the second divided output pulse at LBS in "0" state.

That is, the output signal of the NAND gate 40, which generates a first divided output pulse, changes at $t=t_1, t_3, t_5$ and $t_7$ as shown in FIG. 38(o). But the output level of the NAND gate 53, generates a second divided output pulse, changes from "1" to "0" at a time when a half clock period has passed from $t=t_6$ in a case where the LBS is "1" as shown in FIG. 3(q).

Since the number of the clock pulses in the period from $t=t_5$ to $t=t_7$ is two thousand and one when the program value is 2001, the period $T_{D1}$ of the divided pulse shown in FIG. 3(s) has a constant duration equivalent to 1000.5 times as long as that of the clock pulse period.

In case the LSB is "0", the period $T_{DO}$ of the divided pulse has a duration equivalent to 1000 times the clock pulse period. When the program value is 2002, the period of the divided pulse is a duration equivalent to 1001 times as long as the clock pulse, and when the program value is 2003, the period of the divided pulse is a duration equivalent to 1001.5 times the clock pulse period.

In the programmable frequency divider of the present invention, the period of the divided value can be varied by a unit interval of half a clock pulse period. Therefore when, for example, the nominal frequency of the divided output pulse is 2000 Hz and it is required to change the divided output pulse by the unit of 1 Hz as mentioned in the description of the prior art in the introductory part of this specification, a signal with a frequency of only 2 MHz is sufficient as the clock pulse, and it is possible to realize the determined objective by a clock pulse of the frequency of one half of the clock pulse in the conventional apparatus.

Consequently, power consumption can be reduced and furthermore the operable limit frequency can be raised twice that of the conventional apparatus.

For example, the operable limit frequency of the synchronous counter using the present high speed TTL (transistor-transistor logic) is about 30 MHz, and therefore the nominal output frequency of the divided pulse of the programmable counter having a nominal divided value of two-thousand in accordance with the prior art is as low as 15 KHz. However, according to the present invention, a higher nominal frequency of 30 KHz can be obtained.

In the embodiment described in FIGS. 1 and 2, the programmable counter and first and second control circuits are constructed so as to operate in the positive logic, but of course they can be constructed so as to operate in negative logic (in this latter case, the logic levels "1" and "0" of the program value are reversed). Further, not only a down counter of the preset-type but also an up counter of the reset-type can be used as the programmable counter.

And in the abovementioned embodiment, the first control circuit is constructed so as to generate the preset pulse $T_1$ having the duration equivalent to that of half of the clock pulse period, the second control circuit is constructed so as to generate the preset pulse $T_2$ having the duration equivalent to that of one half of the clock pulse period when the LSB is "0" and to generate the preset pulse having the duration equivalent to 1.5 times as long as that of the clock pulse period when the LSB is "1". However, in a case where the operation frequency of the programmable counter is low and the response thereof is slow, the width of the preset pulse $T_1$ can be widened by a half of the clock pulse period.

In the first and second control circuits shown in FIGS. 1 and 2, the width of the preset pulse can be widened by a half of the clock pulse period by an addition of a set comprising a RS-FF having two NAND gates and one NAND gate as a pre-stage thereof. In a case where the width of the preset pulse is widened, it is of course necessary to construct the circuit so as to make the difference between the preset pulse width $T_1$ of the first control circuit and the preset pulse width $T_2$ of the second control circuit to be an odd clock number.

The programmable frequency divider according to the present invention comprises, as mentioned above, the programmable counter receiving the program value except the LSB, the first control circuit controlling the first counting operation of the programmable counter and the second control circuit controlling the second counting operation of the programmable counter, so as to increase the pause period of the programmable counter by one clock pulse period by the second control circuit when the LSB is "1". By such construction, a desired output frequency can be obtained by using a clock pulse frequency of only half that needed in conventional apparatus. And furthermore the output frequency can be easily changed to one-half or twice as high as that of the reference output frequency.

I claim:

1. A programmable frequency divider, comprising:
    a programmable counter for counting clock pulses applied to an input terminal thereof, and has program terminals for application of a program value except the least significant bit thereof,
    detecting means for generating a count-end pulse upon detection of the end of a counting operation of said programmable counter,
    a first control circuit for generating a first divided output pulse after generation of one of said count-end pulses, and for controlling restarting of said counting operation of said programmable counter after a lapse of time $T_1$ from said count-end pulse generation of said detecting means,
    a second control circuit for generating a second divided output pulse after generation of another count-end pulse, and for controlling restarting of said counting operation of said programmable counter after a lapse of time $T_2$ from said another count-end pulse generation of said detecting means; and
    means for mixing said first and said second divided output pulses producing an output signal,
    wherein the time $T_1$ and the time $T_2$ are the same duration when said least significant bit of said program value is one logic level, and differ by one clock pulse period when said least significant bit is the other logic level.

2. A divider in accordance with claim 1, further comprising a second mixing means for controlling the mixing operation of the first mixing means, said first mixing means responding to logic levels of an input signal applied to said second mixing means.

3. A divider in accordance with claim 1 or 2, wherein said programmable counter comprises a down counter of a preset-type, wherein said first control circuit generates a first preset pulse having said $T_1$ time period, wherein said second control circuit generates a second preset pulse having said $T_2$ time period, and wherein the $T_1$ time period and the $T_2$ time period differ by one clock pulse period.

4. A programmable frequency divider in accordance with claim 1 or 2, wherein said programmable counter comprises flip-flops of a number one less than a number of a program bit.

5. A programmable frequency divider in accordance with claim 1 or 2, wherein said first control circuit comprises:
    a first flip-flop which is set by said count-end pulse of said detecting means,
    a second flip-flop which is set by a NAND signal produced by said clock pulse and one of the output signals of said first flip-flop, and
    a first NAND gate which produces a NAND signal produced by one of the output signals of said first and second flip-flops.

6. A programmable frequency divider in accordance with claim 5, wherein said second control circuit comprises:

a third flip-flop which is set by a NAND signal produced by one of the output signals of said second flip-flop and said count-end pulse of said detecting means, a fourth flip-flop which is set by a NAND signal produced by one of the output signals of said third flip-flop and said clock pulse, a fifth flip-flop which is set by a NAND signal produced by one of the output signals of said fourth flip-flop and said clock pulse, a second NAND gate which produces a NAND signal produced by one of the output signals of said third flip-flop, one of the output signals of said fourth flip-flop and an inverted logic level signal of said least significant bit, and a third NAND gate which produces a NAND signal produced by one of the output signals of said fourth flip-flop, one of the output signals of said fifth flip-flop, and the logic level signal of said least significant bit.

7. A programmable frequency divider comprising:
a programmable counter which counts clock pulses applied to an input terminal thereof, and having program terminals for application of a program value except the least significant bit thereof, a detecting means which generates a count-end pulse upon detection of the end of a counting operation of said programmable counter, a first control circuit which controls restarting of said counting operation of said programmable counter after a lapse of time $T_1$ from a first pulse generation of said detecting means, and a second control circuit which controls restarting of said counting operation of said programmable counter after a lapse of time $T_2$ from a second pulse generation of said detecting means;

wherein said first control circuit comprises a first flip-flop which is set by said count-end pulse of said detecting means, a second flip-flop which is set by a NAND signal produced by said clock pulse and one of the output signals of said first flip-flop, and a first NAND gate which produces a NAND signal produced by one of the output signals of said first and second flip-flops, and wherein the time $T_1$ and $T_2$ are the same duration when said least significant bit is one logic level and differ by one clock pulse period when said least significant bit is the other logic level.

8. A programmable frequency divider comprising:
a programmable counter which counts clock pulses applied to an input terminal thereof, and having program terminals for application of a program value except the least significant bit thereof, a detecting means which generates a count-end pulse upon detection of the end of a counting operation of said programmable counter, a first control circuit having first and second flip-flops which controls restarting of said counting operation of said programmable counter after a lapse of time $T_1$ from a first pulse generation of said detecting means, and a second control circuit which controls restarting of said counting operation of said programmable counter after a lapse of time $T_2$ from a second pulse generation of said detecting means;

wherein said second control circuit comprises a third flip-flop which is set by a NAND signal produced by one of the output signals of said second flip-flop and said count-end pulse of said detecting means, a fourth flip-flop which is set by a NAND signal produced by one of the output signals of said third flip-flop and said clock pulse, a fifth flip-flop which is set by a NAND signal produced by one of the output signals of said fourth flip-flop and said clock pulse, a second NAND gate which produces a NAND signal produced by one of the output signals of said third flip-flop, one of the output signals of said fourth flip-flop and an inverted logic level signal of said least significant bit, and a third NAND gate which produces a NAND signal produced by one of the output signals of said fourth flip-flop, one of the output signals of said fifth flip-flop, and the logic level signal of said least significant bit, wherein the time $T_1$ and the time $T_2$ are the same duration when said least significant bit is one logic level and differ by one clock pulse period when said least significant bit is the other logic level.

* * * * *